United States Patent

Nakai et al.

[11] Patent Number: 5,956,281
[45] Date of Patent: Sep. 21, 1999

[54] SEMICONDUCTOR MEMORY DEVICE CAPABLE OF SETTING SUBSTRATE VOLTAGE SHALLOW IN DISTURB TEST MODE AND SELF REFRESH MODE

[75] Inventors: Jun Nakai; Masanori Hayashikoshi, both of Hyogo, Japan

[73] Assignee: Mitsubishi Denki Kabushiki Kaisha, Tokyo, Japan

[21] Appl. No.: 09/039,270

[22] Filed: Mar. 16, 1998

[30] Foreign Application Priority Data

Sep. 12, 1997 [JP] Japan ................................ 9-248727

[51] Int. Cl.⁶ .................................................. G11C 7/00
[52] U.S. Cl. ........................................ 365/222; 365/201
[58] Field of Search .................................. 365/201, 222, 365/230.06

[56] References Cited

U.S. PATENT DOCUMENTS 5,396,114 3/1995 Lee et al. ............................... 327/535
5,633,825 5/1997 Sakuta et al. ...................... 365/189.09
5,770,964 6/1998 Suma ...................................... 327/328
5,875,146 2/1999 Itou ..................................... 365/230.06

FOREIGN PATENT DOCUMENTS 8-329674 12/1996 Japan .

*Primary Examiner*—David Nelms
*Assistant Examiner*—M. Tran
*Attorney, Agent, or Firm*—McDermott, Will & Emery

[57] ABSTRACT

A switching circuit is provided which activates a shallow level detector and inactivates a deep level detector when a disturb test signal or a self refresh signal is activated. Accordingly, a shallow substrate voltage at the same level as a detection level of the shallow level detector can be generated by a substrate voltage generating circuit not only in a disturb test mode but also in a self refresh mode. As a result, the area penalty due to the shallow level detector is reduced.

7 Claims, 4 Drawing Sheets

FIG. 4
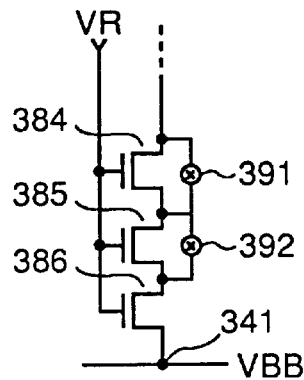
FIG. 5
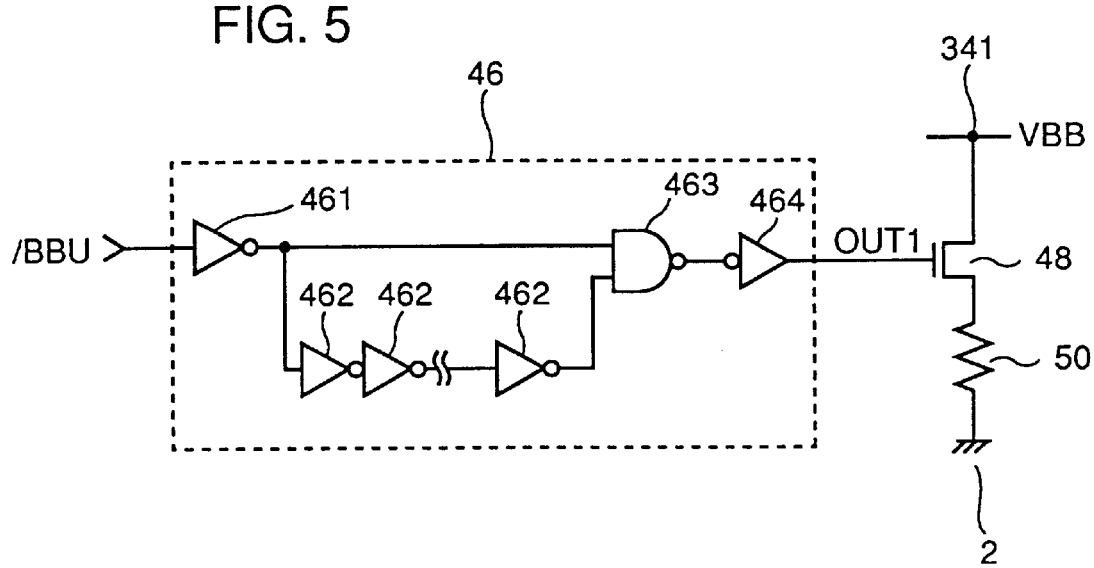
FIG. 6A /BBU
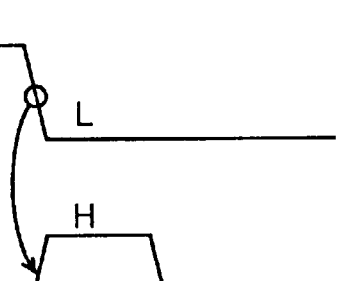
FIG. 6B OUT1

FIG. 7
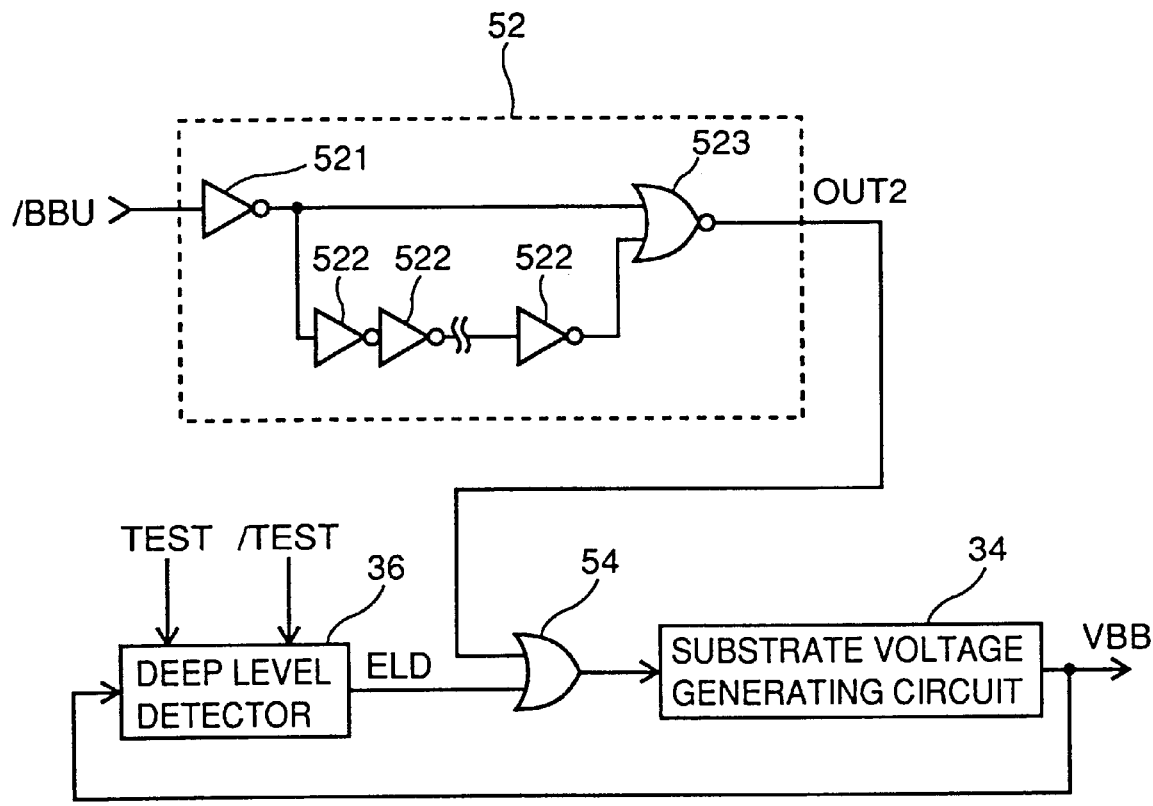
FIG. 8A /BBU
FIG. 8B OUT2
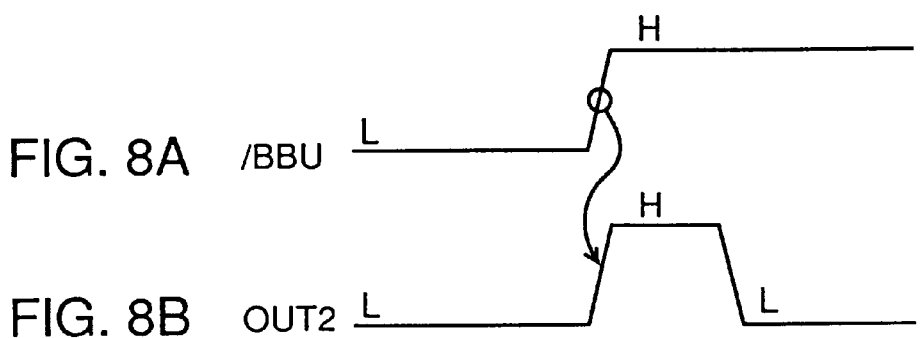

SEMICONDUCTOR MEMORY DEVICE CAPABLE OF SETTING SUBSTRATE VOLTAGE SHALLOW IN DISTURB TEST MODE AND SELF REFRESH MODE

BACKGROUND OF THE INVENTION

1. Field of the Invention

The present invention relates to semiconductor memory devices and, more particularly, to a dynamic random access memory (DRAM) operable in a normal operation mode, a disturb test mode, and a self refresh mode.

2. Description of the Background Art

A semiconductor memory device called a DRAM, which stores data by accumulating charges in its capacitor, should be refreshed before the data is lost. Causes of data loss are disturb error attributable to a sub-threshold current of an access transistor, and pause error due to a leakage current in a PN junction of a storage node. Accordingly, some conventional DRAMs have a disturb test mode for conducting a disturb error accelerated test. In the disturb test mode, a predetermined data is written into a memory cell, a word line is frequently activated/inactivated repeatedly, and then it is examined whether or not the memory cell has retained the predetermined data within.

A semiconductor substrate, on which a memory cell and the others are formed, is usually biased with a negative substrate voltage so as to avoid latch up or the like. If this substrate voltage is set deeper, or the absolute value of the substrate voltage is made larger, disturb error is reduced while pause error is enhanced. Conversely, if the substrate voltage is set shallower, or the absolute value of the substrate voltage is made smaller, disturb error is enhanced whereas pause error is reduced. Therefore, in the disturb test mode, the substrate voltage is set shallow for further accelerating the disturb error.

Meanwhile, a DRAM having a self refresh mode is also available, which automatically performs refresh during standby. In the self refresh mode, the substrate voltage is set shallow so as to extend a refresh cycle during the mode to reduce power consumption. This is because pause error will have more adverse effects on data erasure than disturb error during standby, when a memory cell is not accessed.

In Japanese Patent Laying-Open No. 8-329674, for example, a substrate voltage generating circuit for setting the substrate voltage shallow in a self refresh mode is disclosed. The substrate voltage generating circuit includes: a first voltage generating circuit for generating a deep substrate voltage in a normal operation mode; a first level sensor for determining the level of a substrate voltage generated by the first voltage generating circuit; a second voltage generating circuit for generating a shallow substrate voltage during standby; and a second level sensor for determining the level of a substrate voltage generated by the second voltage generating circuit.

When manufacturing a DRAM having both of the above-described disturb test mode and self refresh mode, providing separate circuits for generating a shallow substrate voltage, one for a disturb test mode and the other for a self refresh mode, will result in an increased layout area penalty.

Further, when such a DRAM enters a disturb test mode or a self refresh mode from a normal operation mode, the substrate voltage should be made shallower, so that a problem will arise that the transition from the normal operation mode to the disturb test mode or the self refresh mode will take relatively long time.

Similarly, when the same DRAM returns from the disturb test mode or the self refresh mode to the normal operation mode, the substrate voltage must be brought back to a deeper level, which will again lead to the problem as described above that transition time from the disturb test mode or the self refresh mode to the normal operation mode will become long.

SUMMARY OF THE INVENTION

An object of the present invention is to provide a semiconductor memory device having a disturb test mode and a self refresh mode which allows setting of a shallow substrate voltage without increasing area penalty.

Another object of the present invention is to provide a semiconductor memory device capable of quickly entering a disturb test mode or a self refresh mode from a normal operation mode.

A further object of the present invention is to provide a semiconductor memory device capable of quickly returning from a disturb test mode or a self refresh mode to a normal operation mode.

According to the present invention, a semiconductor memory device with a normal operation mode, a disturb test mode and a self refresh mode includes a memory cell, substrate voltage generating circuitry, first substrate voltage detecting circuitry, second substrate voltage detecting circuitry, and activating circuitry. The memory cell includes an access transistor. The substrate voltage generating circuitry generates a substrate voltage to be applied to the substrate of the access transistor. The first substrate voltage detecting circuitry detects a substrate voltage from the substrate voltage generating circuitry and activates the substrate voltage generating circuitry when the absolute value of the detected substrate voltage is smaller than a first threshold value. The second substrate voltage detecting circuitry detects a substrate voltage from the substrate voltage generating circuitry and activates the substrate voltage generating circuit when the absolute value of the detected substrate voltage is smaller than a second threshold value which is smaller than the first threshold value. The activating circuitry activates the first substrate voltage detecting circuitry in a normal operation mode, and activates the second substrate voltage detecting circuitry in a disturb test mode and a self refresh mode.

Preferably, the activating circuitry includes test signal generating circuitry and control circuitry. The test signal generating circuitry generates a test signal. The control circuitry controls the test signal generating circuitry so that it will activate the test signal when either a disturb test signal designating the disturb test mode or a self refresh signal designating the self refresh mode is activated, and inactivate the test signal when both of the disturb test signal and the self refresh signal are inactivated. The first substrate voltage detecting circuitry is inactivated in response to the activated test signal, and the second substrate voltage detecting circuitry is activated in response to the activated test signal.

The control circuitry preferably includes a logical sum circuit receiving the disturb test mode signal and the self refresh mode signal.

The second substrate voltage detecting circuitry preferably includes a threshold circuit permitting an adjustment of the second threshold value.

Preferably, the threshold circuit includes a plurality of transistors and a switching element. The plurality of transistors are connected in series. The switching element is connected parallel to at least one of the plurality of transistors.

It is preferable that the semiconductor memory device as described above further includes connecting circuitry which connects the substrate voltage to a ground node for a predetermined period of time when entering a disturb test mode and a self refresh mode.

It is also preferable that the semiconductor memory device further includes pre-activating circuitry which pre-activates the substrate voltage generating circuitry when exiting from the disturb test mode and the self refresh mode.

A semiconductor memory device according to the present invention activates the second substrate voltage detecting circuitry having a second threshold value which is smaller than a first threshold value of the first substrate voltage detecting circuitry in a disturb test mode and a self refresh mode, so that the absolute value of a substrate voltage can be set smaller not only in the disturb test mode but also in the self refresh mode without increasing area penalty.

Further, only a logical sum circuit is provided for receiving a disturb test signal and a self refresh signal to activate a test signal when either the disturb test signal or the self refresh signal is activated, and thus the semiconductor memory device above can be accomplished in a simple circuit configuration.

Furthermore, in the same memory device, substrate voltage detecting circuitry, which is activated in the disturb test mode and the self refresh mode, includes a threshold circuit permitting its threshold to be adjusted, whereby an appropriate threshold value can be set depending on an ability for pause refresh of the device.

Moreover, the threshold circuit is formed of a plurality of transistors and a switching element, so that a simple circuit configuration can be realized.

Furthermore, when entering the disturb test mode and the self refresh mode, a substrate is connected to a ground node for a prescribed period of time, so that the substrate voltage can quickly be changed.

Still further, the substrate voltage generating circuit is pre-activated when exiting from the disturb test mode and the self refresh mode, and thus the substrate voltage can quickly be returned to the original level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing the main structure of a DRAM according to a second embodiment of the present invention.

FIG. 5 is a circuit diagram showing the main structure of a DRAM according to a third embodiment of the present invention.

FIGS. 6A and 6B, are timing charts illustrating an operation of the one-shot pulse activating circuit shown in FIG. 5.

FIG. 7 is a circuit diagram showing the main structure of a DRAM according to a fourth embodiment of the present invention.

FIGS. 8A and 8B are timing charts illustrating an operation c)f the one-shot pulse generating circuit shown in FIG. 7.

DESCRIPTION OF THE PREFERRED EMBODIMENTS

Figure 1:
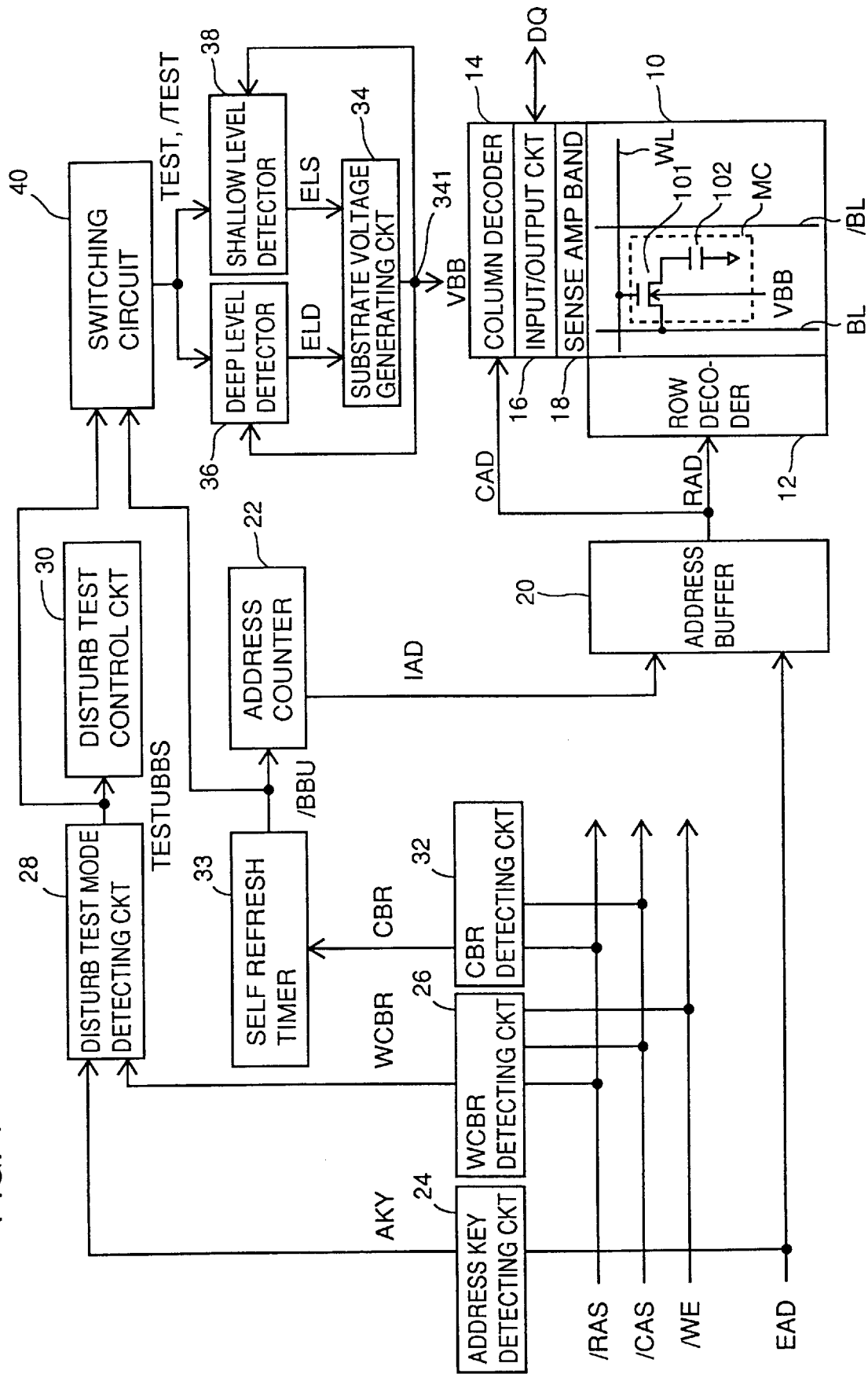
FIG. 1 is a block diagram showing the entire structure of DRAM according to a first embodiment of the present invention.

In the following, embodiments of the present invention will be described with reference to the drawings. In the drawings, the same or corresponding portions are denoted by same reference characters, and thus description thereof is not repeated.

First Embodiment

FIG. 1 is a block diagram showing the entire structure of a DRAM according to a first embodiment of the present invention. Referring to FIG. 1, the DRAM includes a memory cell array 10, a row decoder 12, a column decoder 14, an input/output circuit 16, a sense amplifier band 18, and an address buffer 20.

Memory cell array 10 includes a plurality of memory cells arranged in rows and columns, a plurality of word lines arranged in rows, and a plurality of bit line pairs arranged in columns. In FIG. 1, one memory cell MC, one word line WL, and one bit line pair BL, /BL are typically illustrated. Each memory cell MC includes an access transistor 101 and a capacitor 102. Access transistor 101 has a gate connected to word line WL, and is connected between bit line BL and capacitor 102.

Row decoder 12 selectively activates word line WL in response to a row address signal RAD from address buffer 20. Column decoder 14 selectively activates a column select line (not shown) in response to a column address signal CAD from address buffer 20. Input/output circuit 16 includes an input/output (I/O) line pair (not shown), and a plurality of column select gates (not shown) connected between the plurality of bit line pairs BL, /BL and the I/O line pairs and turned on/off in response to a column select signal from the column select line. Sense amplifier band 18 includes a plurality of sense amplifiers which amplify data signals of the plurality of bit line pairs BL, /BL, respectively. In a normal operation mode, address buffer 20 supplies to row decoder 12 an external address signal EAD as row address signal RAD in response to a row address strobe signal /RAS, and also supplies to column decoder 14 an external address signal EAD as column address signal CAD in response to a column address strobe signal /CAS. In a self refresh mode, address buffer 20 supplies to row decoder 12 an internal address signal IAD from an address counter 22, which will be described later, as row address signal RAD.

The DRAM further includes an address key detecting circuit 24, a WCBR detecting circuit 26, a disturb test mode detecting circuit 28, and a disturb test control circuit 30. Address key detecting circuit 24 generates an address key signal AKY when a voltage higher than a power supply voltage is applied to a predetermined bit of external address signal EAD. WCBR detecting circuit 26 generates a special mode signal WCBR when it detects a timing of WCBR (/WE, /CAS before /RAS), where a write enable signal /WE and column address strobe signal /CAS are activated before the activation of row address strobe signal /RAS. When the special mode signal WCBR is activated and address key signal AKY is also activated, disturb test mode detecting circuit 28 generates a disturb test signal TESTUBBS designating a disturb test mode. Disturb test control circuit 30 controls internal circuits, including row decoder 12, so that they will conduct a disturb test in response to disturb test signal TESTUBBS from disturb test mode detecting circuit 28.

The DRAM is further provided with a CBR detecting circuit 32, a self refresh timer 33, and an address counter 22. CBR detecting circuit 32 generates a special mode signal CBR when it detects a timing of CBR (/CAS before /RAS), where column address strobe signal /CAS is activated before the activation of row address strobe signal /RAS. Once a predetermined period of time has passed after the activation of special mode signal CBR, self refresh timer 33 generates a self refresh signal /BBU designating a self refresh mode. Address counter 22 sequentially generates internal address signal IAD in response to self refresh signal /BBU from self refresh timer 33.

The DRAM further includes a substrate voltage generating circuit 34, a deep level detector 36, a shallow level detector 38, and a switching circuit 40. The substrate voltage generating circuit 34 generates a substrate voltage VBB to be supplied to a substrate of access transistor 101. Deep level detector 36 detects substrate voltage VBB from substrate voltage generating circuit 34 and, when the absolute value of the detected substrate voltage VBB is smaller than a predetermined first threshold value, or the substrate voltage VBB is shallower than a predetermined first detection level, generates a deep level activation signal ELD for activating substrate voltage generating circuit 34. Shallow level detector 38 detects substrate voltage VBB from substrate voltage generating circuit 34, and when the value of the detected substrate voltage VBB is smaller than a predetermined second threshold value, or the substrate voltage VBB is shallower than a predetermined second detection level, generates a shallow level activation signal ELS for activating substrate voltage generating circuit 34. Here, it is understood that the second threshold value is smaller than the first threshold value, i.e., the second detection level is shallower than the first detection level. In a normal operation mode, where neither disturb test signal TESTUBBS nor self refresh signal /BBU is activated, switching circuit 40 activates deep level detector 36 and inactivates shallow level detector 39. In a disturb test mode with disturb test signal TESTUBBS activated, or in a self refresh mode having self refresh signal /BBU activated, switching circuit 40 inactivates deep level detector 36 and activates shallow level detector 38. More specifically, when the test signal TEST from switching circuit 40 attains a low (L) level and the test signal /TEST therefrom attains a high (H) level, deep level detector 36 is activated and shallow level detector 38 is inactivated. Conversely, when test signal TEST attains an H level and test signal /TEST attains an L level, deep level detector 36 is inactivated and shallow level detector 38 is activated.

Figure 2:
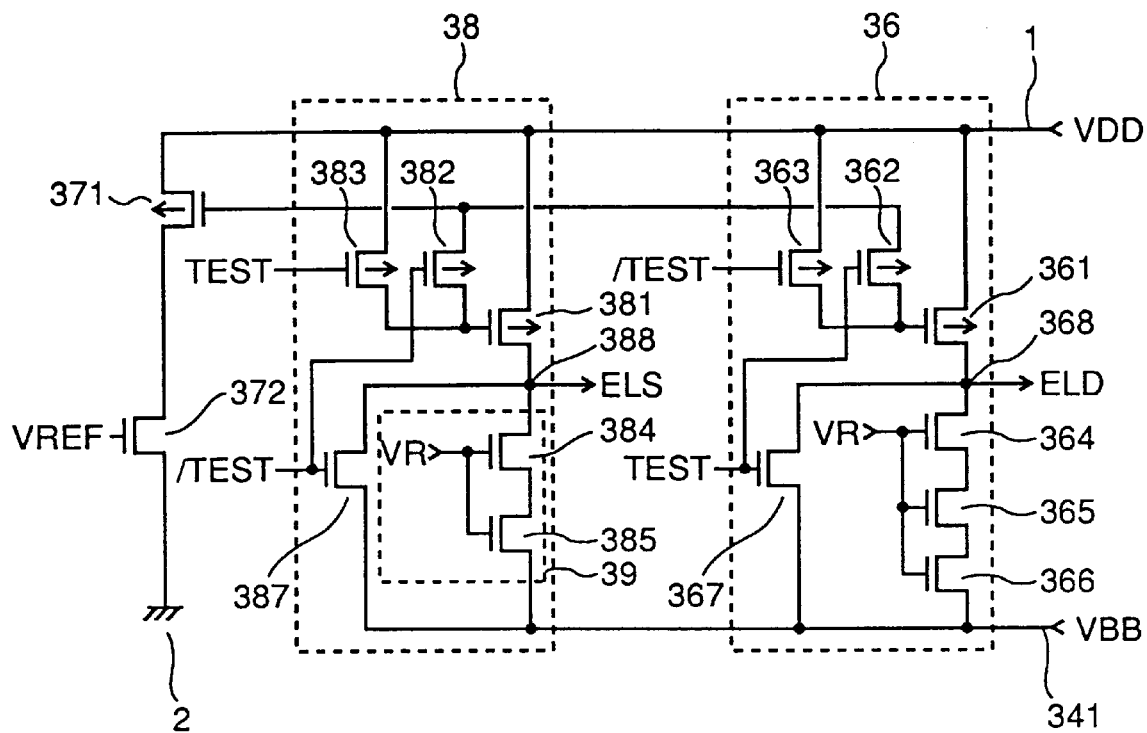
FIG. 2 is a circuit diagram showing the structure of the deep-level detector and the shallow-level detector shown in FIG. 1.

FIG. 2 is a circuit diagram showing structures of deep level detector 36 and shallow level detector 38 shown in FIG. 1. Referring to FIG. 2, deep level detector 36 includes P channel MOS transistors 361–363 and N channel MOS transistors 364–367. P channel MOS transistor 361 is connected between a power supply node 1 and an output node 368. P channel MOS transistor 362 is connected between the gate of P channel MOS transistor 371 and the gate of P channel MOS transistor 361, and is turned on/off in response to test signal TEST. P channel MOS transistor 363 is connected between power supply node 1 and the gate of P channel MOS transistor 361, and is turned on/off in response to test signal /TEST. N channel MOS transistors 364–366 are connected in series between output node 368 and an output node 341 of substrate voltage generating circuit 34, and each has a gate receiving a common reference voltage VR. N channel MOS transistor 367 is connected between output node 368 and output node 341, and is turned on/off in response to test signal TEST.

Shallow level detector 38 includes P channel MOS transistors 381–383 and N channel MOS transistors 384, 385 and 387. P channel MOS transistor 381 is connected between power supply node 1 and output node 388. P channel MOS transistor 382 is connected between the gate of P channel MOS transistor 371 and the gate of P channel MOS transistor 381, and turned on/off in response to test signal /TEST. P channel MOS transistor 383 is connected between power supply node 1 and the gate of P channel MOS transistor 381, and turned on/off in response to test signal TEST. N channel MOS transistors 384 and 385 are connected in series between output node 388 and output node 341 of substrate voltage generating circuit 34, and each has a gate receiving a common reference voltage VR. N channel MOS transistor 387 is connected between output node 388 and output node 341, and turned on/off in response to test signal /TEST.

Further, between power supply node 1 and a ground node 2, a P channel MOS transistor 371 and an N channel MOS transistor 372 are connected in series. N channel MOS transistor 372 has a gate receiving reference voltage VREF.

When test signal TEST attains an L level and test signal /TEST attains an H level, P channel MOS transistor 362 is turned on, P channel MOS transistor 363 and N channel MOS transistor 367 are turned off, and thus deep level detector 36 is activated. Therefore, if the absolute value of the detected substrate voltage VBB is smaller than a predetermined first threshold value, or the substrate voltage VBB is shallower than a predetermined first detection level, then deep level activation signal ELD is activated to an H level, and conversely, if the absolute value of the detected substrate voltage VBB is larger than the predetermined first threshold value, or the substrate voltage VBB is deeper than the predetermined first detection level, then deep level activation signal ELD is inactivated to an L level. Here, the predetermined first threshold value is set to 2V, for example, by N channel MOS transistors 364–366. In other words, the predetermined first detection level is set to –2V, for example, by N channel MOS transistors 364–366.

As described above, when deep level detector 36 is activated, P channel MOS transistors 381 and 382 are turned off, P channel MOS transistor 383 and N channel MOS transistor 387 are turned on, and thus shallow level detector 38 is inactivated. Accordingly, shallow level activation signal ELS remains at an inactive L level regardless of the detected substrate voltage VBB.

Conversely, when test signal TEST attains an H level and test signal /TEST attains an L level, P channel MOS transistor 382 is turned on, P channel MOS transistor 383 and N channel MOS transistor 387 are turned off, and thus shallow level detector 38 is activated. Therefore, if the absolute value of the detected substrate voltage VBB is smaller than a predetermined second threshold value, or the substrate voltage VBB is shallower than a predetermined second detection level, then shallow level activation signal ELS is activated to an H level, and conversely, if the absolute value of the detected substrate voltage VBB is larger than the predetermined second threshold value, or the substrate voltage VBB is deeper than the predetermined second detection level, then shallow level activation signal ELS is inactivated to an L level. Here, the predetermined second threshold value is set to 1V, for example, by the threshold voltage of N channel MOS, transistors 384 and 385. That is, the predetermined second detection level is set to –1V, for example, by the threshold voltage of N channel MOS transistors 384 and 385. N channel MOS transistors 384 and 385 thus constitute a threshold circuit 39 which determines a predetermined second threshold value or second detection level.

Figure 3:
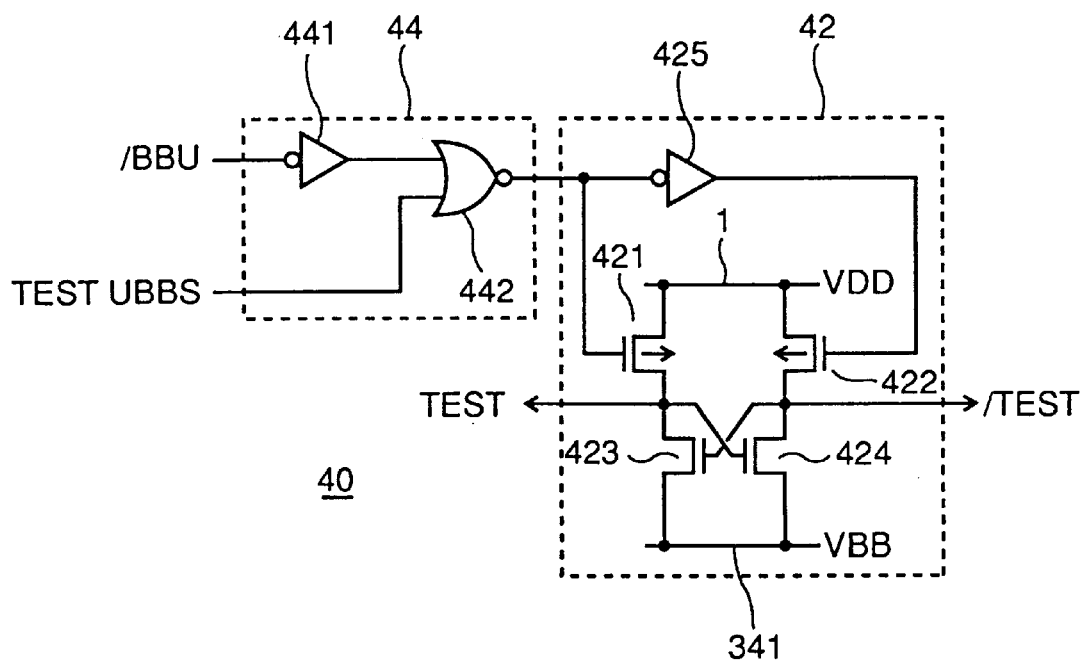
FIG. 3 is a circuit diagram showing the structure of the switching circuit shown in FIG. 1.

FIG. 3 is a circuit diagram showing a structure of the switching circuit 40 shown in FIG. 1. Referring to FIG. 3, the switching circuit 40 includes a test signal generating circuit 42 which generates test signals TEST and /TEST, and a control circuit 44 which controls test signal generating circuit 42 in response to disturb test signal TESTUBBS and self refresh signal /BBU.

Test signal generating circuit 42 includes P channel MOS transistors 421 and 422, N channel MOS transistors 423 and 424, and an inverter circuit 425. P channel MOS transistor 421 and N channel MOS transistor 423 are connected in series between power supply node 1 and the output node 341 of substrate voltage generating circuit 34. P channel MOS transistor 422 and N channel MOS transistor 424 are also connected in series between power supply node 1 and output node 341. P channel MOS transistor 421 is turned on/off in response to an output signal of control circuit 44. P channel MOS transistor 422 is turned on/off in response to an inverted signal of the output signal of control circuit 44. The gate of N channel MOS transistor 423 is connected to the drain of P channel MOS transistor 422, and the gate of N channel MOS transistor 424 is connected to the drain of P channel MOS transistor 421.

Control circuit 44 includes an inverter circuit 441 and logical sum (NOR) circuit 442. Inverter circuit 441 receives self refresh signal /BBU and provides its inverted signal to logical sum circuit 442. Logical sum circuit 442 receives the inverted signal of self refresh signal /BBU from inverter circuit 441 and disturb test signal TESTUBBS, and outputs their logical sum signal to test signal generating circuit 42.

When self refresh signal /BBU is activated to an L level, or disturb test signal TESTUBBS is activated to an L level, control circuit 44 supplies an output signal at an L level to test signal generating circuit 42. Accordingly, P channel MOS transistor 421 and N channel MOS transistor 424 are turned on, P channel MOS transistor 422 and N channel MOS transistor 423 are turned off, and thus test signal TEST attains an H level and test signal /TEST attains an L level.

Meanwhile, when self refresh signal /BBU is set to an H level and disturb test signal TESTUBBS is set to an L level, control circuit 44 provides an output signal at an H level to test signal generating circuit 42. Consequently, P channel MOS transistor 422 and N channel MOS transistor 423 are turned on, P channel MOS transistor 421 and N channel MOS transistor 424 are turned off, and therefore, test signal TEST attains an L level and test signal /TEST attains an H level.

In the following, an operation of the DRAM having a structure as described above in the normal operation mode, disturb test mode, and self refresh mode will be described in order.

(1) Normal Operation Mode

Referring back to FIG. 1, in a normal operation mode, since none of the following signals, address key signal AKY, special mode signals WCBR and CBR, are activated, neither disturb test signal TESTUBBS nor self refresh signal /BBU is activated. Accordingly, disturb test signal TESTUBBS at an L level and self refresh signal /BBU at an H level are provided to switching circuit 40 shown in FIG. 3. In response to the L level disturb test signal TESTUBBS and the H level self refresh signal /BBU, control circuit 44 provides an output signal at an H level to test signal generating circuit 42. In response to this H level output signal, test signal generating circuit 42 generates test signal TEST at an L level and test signal /TEST at an H level.

When the L level test signal TEST and the H level test signal /TEST are supplied to deep level detector 36 and shallow level detector 38 shown in FIG. 2, deep level detector 36 is activated while shallow level detector 38 is inactivated. Therefore, if the absolute value of the detected substrate voltage VBB is smaller than a predetermined first threshold value (e.g., 2V), or the substrate voltage VBB is shallower than a predetermined first detection level (e.g., −2V), then deep level activation signal ELD is activated to an H level. Conversely, if the absolute value of the detected substrate voltage VBB is larger than the predetermined first threshold value, or the substrate voltage VBB is deeper than the predetermined first detection level, then deep level activation signal ELD is inactivated to an L level. Meanwhile, since shallow level detector 38 is inactivated, shallow level activation signal ELS is constantly maintained at an L level. Accordingly, substrate voltage generating circuit 34 is activated/inactivated in response to deep level activation signal ELD from deep level detector 36, and thus generates a substrate voltage (e.g., −2V), equal to the predetermined first detection level, and provides it to the substrate of access transistor 101 in memory cell MC.

As described above, in a normal operation mode, the substrate voltage is set at a deep level.

(2) Disturb Test Mode

Referring back to FIG. 1, in a disturb test mode, row address strobe signal /RAS, column address strobe signal /CAS and write enable signal /WE are provided in the WCBR timing, and a voltage higher than a power supply voltage is applied to a predetermined bit of external address signal EAD, so that WCBR detecting circuit 26 detects the WCBR timing and generates special mode signal WCBR, while address key detecting circuit 24 detects the high voltage and generates address key signal AKY. Accordingly, disturb test signal TESTUBBS from disturb test mode detecting circuit 28 is activated to an H level, and in response to this H level disturb test signal TESTUBBS, disturb test control circuit 30 controls internal circuits, including row decoder 12, so that they will effect a disturb test operation. Meanwhile, as self refresh signal /BBU from self refresh timer 33 is held at an H level, self refresh is not performed.

The above-described H level disturb test signal TESTUBBS and the H level self refresh signal /BBU are provided to switching circuit 40 shown in FIG. 3. In response to the H level disturb test signal TESTUBBS and the H level self refresh signal /BBU, switching circuit 40 provides an output signal at an L level to test signal generating circuit 42. Accordingly, test signal generating circuit 42 generates test signal TEST at an H level and test signal /TEST at an L level.

The H level test signal TEST and the L level test signal /TEST are then provided to deep level detector 36 and shallow level detector 38 shown in FIG. 2, and thus deep level detector 36 is inactivated and shallow level detector 38 is activated. Therefore, if the absolute value of the detected substrate voltage VBB is smaller than a predetermined second threshold value (e.g., 1V), or the substrate voltage VBB is shallower than a predetermined second detection level (e.g., −1V), then shallow level activation signal ELS is activated to an H level. Conversely, if the absolute value of the detected substrate voltage VBB is larger than the predetermined second threshold value, or the substrate voltage VBB is deeper than the predetermined second detection level, then shallow level activation signal ELS is inactivated to an L level. Meanwhile, since deep level detector 36 is inactivated, deep level activation signal ELD is constantly held at an L level.

Substrate voltage generating circuit 34 is activated/ inactivated in response to shallow level activation signal ELS from shallow level detector 38, and therefore generates substrate voltage VBB of −1V, for example, equal to the predetermined second detection level, and provides it to the substrate of access transistor 101 in memory cell MC.

Therefore, in a disturb test mode, substrate voltage VBB is set shallower than that in the normal operation mode.

(3) Self Refresh Mode

Referring to FIG. 1 again, in a self refresh mode, row address strobe signal /RAS and column address strobe signal /CAS are provided in the CBR timing. When CBR detecting circuit 32 detects the CBR timing, it generates special mode signal CBR, and a predetermined period of time after the generation of the special mode signal CBR, self refresh signal /BBU from self refresh timer 33 is activated to an L level. In response to this L level self refresh signal /BBU, address counter 22 generates internal address signal IAD and provides it to address buffer 20. At this time, disturb test signal TESTUBBS from disturb test mode detecting circuit 28 is held at an L level.

The above-described self refresh signal /BBU at an L level and disturb test signal TESTUBBS at an L level are provided to switching circuit 40 shown in FIG. 3. In response to the L level self refresh signal /BBU and the L level disturb test signal TESTUBBS, control circuit 44 provides an output signal at an L level to test signal generating circuit 42. Therefore, test signal generating circuit 42 generates, as in the case of the disturb test mode as described above, test signal TEST at an H level and test signal /TEST at an L level.

Consequently, as described with respect to the disturb test mode, substrate voltage generating circuit 34 generates substrate voltage VBB of −1V, for example, at the same level as the above-described predetermined level in response to shallow level activation signal ELS from shallow level detector 38, and provides it to the substrate of access transistor 101 in memory cell MC.

Therefore, substrate voltage VBB in a self refresh mode is, as in the disturb test mode, set at a level shallower than in the normal operation mode.

As described above, according to the first embodiment of the present invention, control circuit 44 is provided, so that shallow level detector 38 is activated not only in the disturb test mode but also in the self refresh mode. Accordingly, as compared to the case in which a shallow level detector for a disturb test mode and another shallow level detector for a self refresh mode are separately provided, the layout area is reduced by the size of one shallow level detector. Therefore, a DRAM can be provided which allows setting of a substrate voltage shallow in a disturb test mode as well as in a self refresh mode without increasing area penalty.

Second Embodiment

Actually manufactured DRAMs have various abilities for pause refresh. If it is kept not being refreshed after data at an H level is written into its memory cell, the level of the data in the memory cell will change from the H level to an L level due to pause error. The ability for pause refresh is expressed by the time until such a data error occurs. The second embodiment of the present invention is directed to provide a DRAM allowing adjustment of a shallow level of the substrate voltage VBB depending on its ability for pause refresh.

FIG. 4 is a circuit diagram showing the structure of a threshold circuit for determining the level of a shallow level detector 38 in a DRAM according to the second embodiment of the present invention. Referring to FIG. 4, in this DRAM, the threshold circuit 39 shown in FIG. 2 has been replaced by a threshold circuit having N channel MOS transistors 384–386 and fuses 391 and 392. N channel MOS transistors 384–386 are connected in series between output node 388 and output node 341 of substrate voltage generating circuit 34 shown in FIG. 2, and each has a gate receiving a common reference voltage VR. Fuse 391 is connected parallel to N channel MOS transistor 384, and fuse 392 is connected parallel to N channel MOS transistor 385.

When neither fuse 391 nor 392 is blown off, the detection level of shallow level detector 38 is determined by the threshold voltage of a single N channel MOS transistor 386. If fuse 391 or 392 is blown off, the detection level is determined by the threshold voltages of two N channel MOS transistors 384 (or 385) and 386. If both of the fuses 391 and 392 are blown off, the detection level is determined by the threshold voltages of the three N channel MOS transistors 384–386.

As described above, according to the second embodiment of the present invention, fuses 391 and 392 are connected parallel to N channel MOS transistors 384 and 385, respectively, and thus the detection level of shallow level detector 38 can be adjusted. Therefore, the level of the substrate voltage can be set appropriately in a disturb test mode as well as in a soft refresh mode, depending on the ability for pause refresh of the device.

Although fuses 391 and 392 are employed in this embodiment, a transistor may be employed alternatively. In this case, by supplying a power supply voltage or a ground voltage to a gate of the transistor by bonding, the same function as the fuse can be obtained. In other words, what is necessary is simply to connect a switching element, which can be turned on/off artificially, parallel to respective N channel MOS transistors 384 and 385. In this case, two transistors 384 and 385 are connected parallel to two fuses 391 and 392, respectively; however, it may be sufficient if a fuse is connected parallel to at least one transistor.

Third Embodiment

When a DRAM according to the above-described embodiments enters the disturb test mode or the self refresh mode from the normal operation mode, substrate voltage VBB becomes shallower. The third embodiment is directed to provide a DRAM in which the substrate voltage VBB can quickly rise from a predetermined deeper level to a predetermined shallower level.

FIG. 5 is a circuit diagram showing the main structure of a DRAM according to the third embodiment of the present invention. Referring to FIG. 5, this DRAM includes, in addition to the structure of the above embodiments, a one-shot pulse generating circuit 46, an N channel MOS transistor 48 connected between output node 341 of the substrate voltage generating circuit and ground node 2, and is turned on/off in response to an output signal OUT1 of one-shot pulse generating circuit 46, and a resistance 50 connected in series to N channel MOS transistor 48. One-shot pulse generating circuit 46 includes an inverter circuit 461, an odd number of inverter circuits 462 each having a delay function, a logical product (NAND) circuit 463, and an inverter circuit 464.

When this DRAM enters the self refresh mode from the normal operation mode, as shown in FIG. 6A, self refresh signal /BBU changes from an H level to an L level. In response to this change of self refresh signal /BBU, as shown in FIG. 6B, one-shot pulse generating circuit 46 generates output signal OUT1 at an H level for a prescribed time period after the activation of self refresh signal /BBU. Since N channel MOS transistor 48 is turned on in response to this H level output signal OUT1, output node 341 of the substrate voltage generating circuit is connected to ground node 2 via resistance 50. Accordingly, the deep substrate voltage VBB in the normal operation node rises towards the ground voltage, and thus becomes shallower quickly.

As described above, according to the third embodiment, when the DRAM enters a self refresh mode, the substrate of access transistor 101 is connected to ground node 2 for a prescribed time period, whereby substrate voltage VBB can quickly be made shallower.

Although self refresh signal /BBU is employed here, it is understood that disturb test signal TESTUBBS or the output signal of control circuit 44 shown in FIG. 3 may be employed alternatively.

Fourth Embodiment

In a DRAM according to the above-described embodiments, substrate voltage VBB is made deeper when returning from the disturb test mode or the self refresh mode to the normal operation mode. The fourth embodiment of the present invention is directed to provide a DRAM in which substrate voltage VBB is quickly made deeper when returning to the normal operation mode from the disturb test mode or the self refresh mode.

FIG. 7 is a circuit diagram showing the main structure of a DRAM according to the fourth embodiment of the present invention. Referring to FIG. 7, this DRAM includes, in addition to the structure of the above-described embodiments, a one-shot pulse generating circuit 52 and a logical sum (OR) circuit 54.

The one-shot pulse generating circuit 52 includes an inverter circuit 521, an odd number of inverter circuits 522 each having a delay function, and a logical sum (NOR) circuit 523. Logical sum (OR) circuit 54 receives an output signal OUT2 from one-shot pulse generating circuit 52 and deep level activation signal ELD from deep level detector 36, and outputs the logical sum signal to substrate voltage generating circuit 34.

When this DRAM returns from the self refresh mode to the normal operation mode, as shown in FIG. 8A, self refresh signal /BBU changes from an L level to an H level. In response to such a change in self refresh signal /BBU, one-shot pulse generating circuit 52 generates output signal OUT2 at an H level for a prescribed time period after the inactivation of self refresh signal /BBU as shown in FIG. 8B.

Since this H level output signal OUT2 is supplied to substrate voltage generating circuit 34 through logical sum circuit 54, substrate voltage generating circuit 34 is activated before deep level detector 36 generates deep level activation signal ELD at an H level.

As described above, according to the fourth embodiment, substrate voltage generating circuit 34 is pre-activated when exiting from the self refresh mode, whereby substrate voltage VBB is quickly set deeper.

Although self refresh signal /BBU is employed here, is possible to employ, alternatively, disturb test signal TESTUBBS, or the output signal of control circuit 44 shown in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal operation mode, a disturb test mode, and a self refresh mode, comprising:

a memory cell including an access transistor;

substrate voltage generating means for generating a substrate voltage to be supplied to a substrate of said access transistor;

first substrate voltage detecting means for detecting the substrate voltage from said substrate voltage generating means and activating said substrate voltage generating means when absolute value of the detected substrate voltage is smaller than a first threshold value;

second substrate voltage detecting means for detecting the substrate voltage from said substrate voltage generating means and activating said substrate voltage generating means when the absolute value of the detected substrate voltage is smaller than a second threshold value which is smaller than said first threshold value; and activating means for activating said first substrate voltage detecting means in said normal operation mode and activating said second substrate voltage detecting means in said disturb test mode and said self refresh mode.

2. The semiconductor memory device according to claim 1, wherein said activating means includes:

test signal generating means for generating a test signal; and control means for controlling said test signal generating means to activate said test signal when either a disturb test signal designating said disturb test mode or a self refresh signal designating said self refresh mode is activated, and to inactivate said test signal when both of said disturb test signal and said self refresh signal are inactivated; and wherein said first substrate voltage detecting means is inactivated in response to said activated test signal, and said second substrate voltage detecting means is activated in response to said activated test signal.

3. The semiconductor memory device according to claim 2, wherein said control means includes a logical sum circuit receiving said disturb test signal and said self refresh signal.

4. The semiconductor memory device according to claim 1, wherein said second substrate voltage detecting means includes a threshold circuit allowing adjustment of said second threshold value.

5. The semiconductor memory device according to claim 4, wherein said threshold circuit includes:

a plurality of transistors connected in series; and a switching element connected parallel to at least one of said plurality of transistors.

6. The semiconductor memory device according to claim 1, further comprising connecting means for connecting said substrate to a ground node for a pre-defined time period after entering said disturb test mode and said self refresh mode.

7. The semiconductor memory device according to claim 1, further comprising pre-activating means for pre-activating said substrate voltage generating means when exiting from said disturb test mode and said self refresh mode.

\* \* \* \* \*